US012477799B2

(12) United States Patent
Hikosaka et al.

(10) Patent No.: US 12,477,799 B2
(45) Date of Patent: Nov. 18, 2025

(54) NITRIDE SEMICONDUCTOR AND SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toshiki Hikosaka, Kawasaki (JP); Hajime Nago, Yokohama (JP); Hisashi Yoshida, Kawasaki (JP); Jumpei Tajima, Mitaka (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 496 days.

(21) Appl. No.: 17/817,789

(22) Filed: Aug. 5, 2022

(65) Prior Publication Data

US 2023/0317796 A1     Oct. 5, 2023

(30) Foreign Application Priority Data

Mar. 10, 2022 (JP) .................. 2022-036878

(51) Int. Cl.
*H01L 29/15* (2006.01)
*H10D 30/47* (2025.01)
(Continued)

(52) U.S. Cl.
CPC ..... *H10D 62/8171* (2025.01); *H10D 30/4738* (2025.01); *H10D 62/824* (2025.01); *H10D 62/8503* (2025.01)

(58) Field of Classification Search
CPC ........... H10D 62/8171; H10D 30/4738; H10D 62/824; H10D 30/475; H10D 64/256;
(Continued)

(56) References Cited

U.S. PATENT DOCUMENTS 9,117,743 B2    8/2015 Komiyama et al.
10,186,588 B1   1/2019 Kato et al.

FOREIGN PATENT DOCUMENTS

JP     2014-222716 A    11/2014
JP     2015-70085 A      4/2015
(Continued)

OTHER PUBLICATIONS

Japanese Office Action issued Mar. 7, 2025 in Japanese Patent Application No. 2022-036878 (with unedited computer-generated English Translation), 15 pages.

*Primary Examiner* — Cuong B Nguyen
(74) *Attorney, Agent, or Firm* — Oblon, McClelland, Maier & Neustadt, L.L.P.

(57) ABSTRACT

According to one embodiment, a nitride semiconductor includes a nitride member. The nitride member includes a first nitride region including $Al_{x1}Ga_{1-x1}N$, a second nitride region including $Al_{x2}Ga_{1-x2}N$, and a third nitride region including $Al_{x3}Ga_{1-x3}N$. The second nitride region is provided between the first and third nitride regions in a first direction from the first nitride region to the second nitride region. The second nitride region includes carbon and oxygen. The first nitride region does not include carbon, or a second carbon concentration in the second nitride region is higher than a first carbon concentration in the first nitride region. The second carbon concentration is higher than a third carbon concentration in the third nitride region. A ratio of a second oxygen concentration in the second nitride region to the second carbon concentration is not less than $1.0 \times 10^{-4}$ and not more than $1.4 \times 10^{-3}$.

20 Claims, 8 Drawing Sheets

(51) Int. Cl.
*H10D 62/815* (2025.01)
*H10D 62/824* (2025.01)
*H10D 62/85* (2025.01)

(58) Field of Classification Search
CPC .. H10D 64/513; H10D 62/60; H10D 62/8164; H10D 62/364; H10D 62/85–854; C01B 21/0632
See application file for complete search history.

(56) References Cited

FOREIGN PATENT DOCUMENTS

| | | | |
|---|---|---|---|
| JP | 2019-57588 | A | 4/2019 |
| JP | 2020-98939 | A | 6/2020 |

# NITRIDE SEMICONDUCTOR AND SEMICONDUCTOR DEVICE

CROSS-REFERENCE TO RELATED APPLICATIONS

This application is based upon and claims the benefit of priority from Japanese Patent Application No. 2022-036878, filed on Mar. 10, 2022; the entire contents of which are incorporated herein by reference.

FIELD

Embodiments of the invention generally relate to a nitride semiconductor and a semiconductor device.

BACKGROUND

For example, it is desirable to improve the characteristics of a semiconductor device such as a transistor or the like.

DETAILED DESCRIPTION

Figure 1:
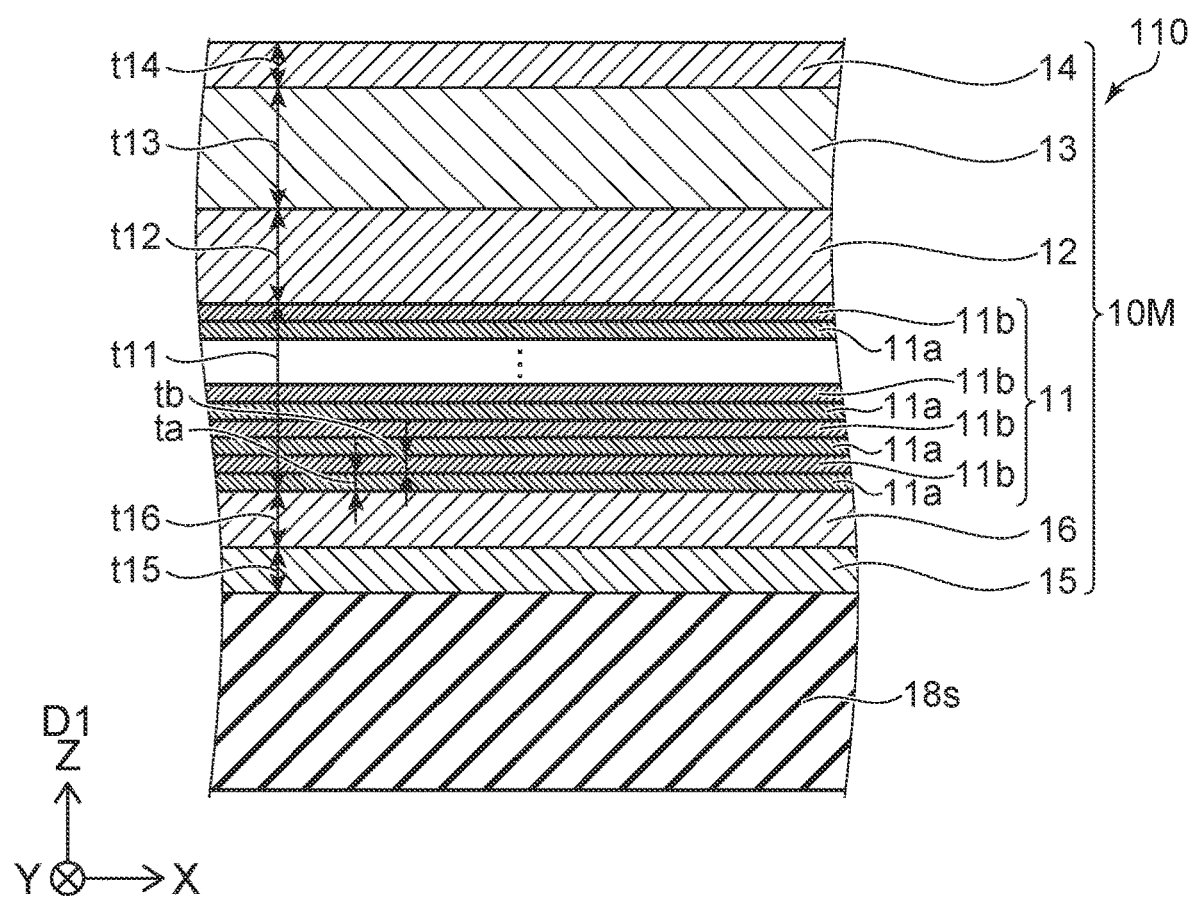
FIG. 1 is a schematic cross-sectional view illustrating the nitride semiconductor according to the first embodiment.

According to one embodiment, a nitride semiconductor includes a nitride member. The nitride member includes a first nitride region including $Al_{x1}Ga_{1-x1}N$ ($0<x1\leq1$), a second nitride region including $Al_{x2}Ga_{1-x2}N$ ($0\leq x2<1$, $x2<x1$), and a third nitride region including $Al_{x3}Ga_{1-x3}N$ ($0\leq x3<1$, $x3<x1$). The second nitride region is provided between the first nitride region and the third nitride region in a first direction from the first nitride region to the second nitride region. The second nitride region includes carbon and oxygen. The first nitride region does not include carbon, or a second carbon concentration in the second nitride region is higher than a first carbon concentration in the first nitride region. The second carbon concentration is higher than a third carbon concentration in the third nitride region. A ratio of a second oxygen concentration in the second nitride region to the second carbon concentration is not less than $1.0\times10^{-4}$ and not more than $1.4\times10^{-3}$.

According to one embodiment, a semiconductor device includes the semiconductor described above, a first electrode, a second electrode, a third electrode, and an insulating member. The nitride member further includes a fourth nitride region including $Al_{x4}Ga_{1-x4}N$ ($0<x4\leq1$, $x3<x4$). The third nitride region is between the second nitride region and the fourth nitride region in the first direction. A direction from the first electrode to the second electrode is along a second direction crossing the first direction. A position of the third electrode in the second direction is between a position of the first electrode in the second direction and a position of the second electrode in the second direction. The third nitride region includes a first partial region, a second partial region, a third partial region, a fourth partial region, and a fifth partial region. A direction from the first partial region to the first electrode is along the first direction. A direction from the second partial region to the second electrode is along the first direction. The third partial region is between the first partial region and the second partial region in the second direction, and a direction from the third partial region to the third electrode is along the first direction. The fourth partial region is between the first partial region and the third partial region in the second direction. The fifth partial region is between the third partial region and the second partial region in the second direction. The fourth nitride region includes a sixth partial region and a seventh partial region. A direction from the fourth partial region to the sixth partial region is along the first direction. A direction from the fifth partial region to the seventh partial region is along the first direction. The insulating member is between the nitride member and the third electrode.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating the nitride semiconductor according to the first embodiment.

As shown in FIG. 1, a nitride semiconductor 110 according to the embodiment includes a nitride member 10M.

The nitride member 10M includes a first nitride region 11, a second nitride region 12, and a third nitride region 13. The second nitride region 12 is provided between the first nitride region 11 and the third nitride region 13.

The first nitride region 11 includes $Al_{x1}Ga_{1-x1}N$ ($0<x1\leq1$). The first nitride region 11 includes, for example, AlGaN. For example, the composition ratio of Al in the first nitride region 11 is, for example, not less than 0.05 and not more than 0.6. As shown in FIG. 1, the first nitride region 11 may have a laminated structure. In this case, the effective (for example, average) composition ratio of Al in the first nitride region 11 is, for example, not less than 0.15 and not more than 0.55. An example of the laminated structure will be described later.

The second nitride region 12 includes $Al_{x2}Ga_{1-x2}N$ ($0\leq x2<1$, $x2<x1$). The composition ratio of Al in the second nitride region 12 is, for example, not less than 0 and not more than 0.25. The second nitride region 12 include, for example, GaN. The second nitride region 12 includes carbon and oxygen.

The third nitride region 13 includes $Al_{x3}Ga_{1-x3}N$ ($0\leq x3<1$, $x3<x1$). The composition ratio of Al in the third nitride region 13 is, for example, not less than 0 and not more than 0.25. The third nitride region 13 includes, for example, GaN.

The third nitride region 13 substantially does not include carbon. Alternatively, the carbon concentration in the third nitride region 13 is lower than the carbon concentration in the second nitride region 12.

A first direction D1 from the first nitride region 11 to the second nitride region 12 is a Z-axis direction. One direction perpendicular to the Z-axis direction is defined as an X-axis direction. The direction perpendicular to the Z-axis direction and the X-axis direction is defined as a Y-axis direction. The first nitride region 11, the second nitride region 12, and the third nitride region 13 are layered along the X-Y plane.

As shown in FIG. 1, the nitride semiconductor 110 may further include a base body 18s. There is a first nitride region 11 between the base body 18s and the second nitride region 12. The base body 18s is, for example, a crystalline substrate. The base body 18s may include, for example, at least one of a silicon substrate, a sapphire substrate, a SiC substrate, or a GaN substrate.

The first nitride region 11 does not include carbon. Alternatively, the concentration of carbon in the second nitride region 12 is higher than the concentration of carbon in the first nitride region 11. The concentration of carbon in the second nitride region 12 is higher than the concentration of carbon in the third nitride region 13.

In the embodiment, a ratio of the oxygen concentration (second oxygen concentration) in the second nitride region 12 to the second carbon concentration is not less than $1.0 \times 10^{-4}$ and not more than $1.4 \times 10^{-3}$. It has been found that in a semiconductor device including such a nitride semiconductor 110, the punch-through voltage in the semiconductor device can be increased. The punch-through voltage corresponds to the voltage at which the current begins to flow rapidly when a voltage is applied between the base body 18s and the third nitride region 13. When the punch-through voltage is high, the breakdown voltage of the semiconductor device is high in the semiconductor device including the nitride semiconductor 110. According to the embodiment, it is possible to provide a nitride semiconductor and a semiconductor device capable of improving the characteristics. An example of a semiconductor device including a nitride semiconductor 110 will be described later.

Experimental results will be explained below.

In the experiment, the nitride member 10M is formed by MOCVD (Metal Organic Chemical Vapor Deposition). In the experiment, the second nitride region 12 is formed on the first nitride region 11 at about 940° C. In the formation of the second nitride region 12, a raw material gas including TMGa (Trimethyl Gallium) and ammonia is supplied in a hydrogen atmosphere. By forming the second nitride region 12 at a low temperature, the second nitride region 12 including carbon and oxygen can be obtained.

The third nitride region 13 is formed on the second nitride region 12 at about 1040° C. In the formation of the third nitride region 13, TMGa and ammonia are supplied in a hydrogen atmosphere. By forming the third nitride region 13 at a high temperature, the third nitride region 13 substantially including no carbon and no oxygen can be obtained.

After that, the fourth nitride region 14 (see FIG. 1) is formed in order to form the semiconductor device. The fourth nitride region 14 includes AlGaN. Further, a source electrode, a drain electrode and a gate electrode are manufactured to obtain a semiconductor device.

Figure 2:
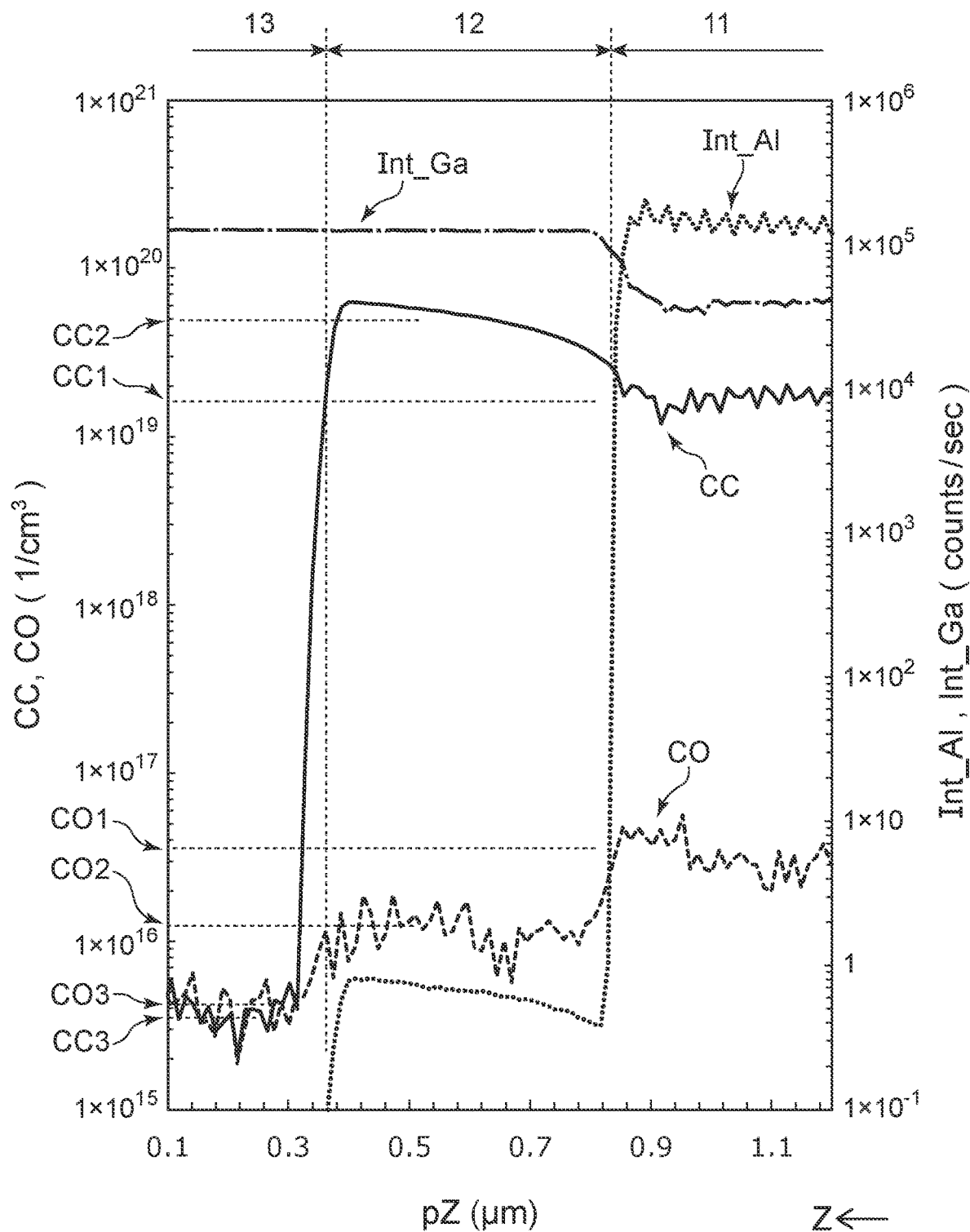
FIG. 2 is a graph illustrating a nitride semiconductor according to the first embodiment.

FIG. 2 is a graph illustrating the nitride semiconductor according to the first embodiment.

FIG. 2 illustrates a result of SIMS (Secondary Ion Mass Spectrometry) analysis of the nitride member 10M. The horizontal axis of FIG. 2 is the position pZ in the Z-axis direction. The vertical axis on the left side of FIG. 2 is the carbon concentration CC and the oxygen concentration CO. The vertical axis on the right side of FIG. 2 is the detection intensity Int_Al of the secondary ion of Al and the detection intensity Int_Ga of the secondary ion of gallium.

As shown in FIG. 2, the carbon concentration CC (second carbon concentration CC2) in the second nitride region 12 is higher than the carbon concentration CC (first carbon concentration CC1) in the first nitride region 11. The second carbon concentration CC2 is higher than the carbon concentration CC (third carbon concentration CC3) in the third nitride region 13. In this example, the first carbon concentration CC1 is about $1.7 \times 10^{19}/cm^3$. The second carbon concentration CC2 is about $5.0 \times 10^{19}/cm^3$. The third carbon concentration CC3 is about $4.0 \times 10^{16}/cm^3$.

On the other hand, the oxygen concentration CO (third oxygen concentration CO3) in the third nitride region 13 is lower than the oxygen concentration CO (first oxygen concentration CO1) in the first nitride region 11. The oxygen concentration CO (second oxygen concentration CO2) in the second nitride region 12 is lower than the oxygen concentration CO (first oxygen concentration CO1) in the first nitride region 11. The oxygen concentration CO (second oxygen concentration CO2) in the second nitride region 12 is between the third oxygen concentration CO3 and the first oxygen concentration CO1. In this example, the first oxygen concentration CO1 is about $3.5 \times 10^{16}/cm^3$. The second oxygen concentration CO2 is about $1.5 \times 10^{16}/cm^3$. The third oxygen concentration CO3 is about $5.0 \times 10^{15}/cm^3$.

As described above, the second nitride region 12 has a high carbon concentration while including oxygen. It is considered that carbon easily functions as an acceptor because the second nitride region 12 includes oxygen. For example, the second nitride region 12 tends to have high resistance. For example, in the second nitride region 12, the hole concentration increases. It is considered that this can increase the punch-through voltage of the nitride semiconductor 110.

In the embodiment, the first carbon concentration CC1 may be, for example, the average value of the carbon concentration CC in the first nitride region 11. The second carbon concentration CC2 may be, for example, the average value of the carbon concentration CC in the second nitride region 12. The third carbon concentration CC3 may be, for example, the average value of the carbon concentration CC in the third nitride region 13.

The first oxygen concentration CO1 may be, for example, the average value of the oxygen concentration CO in the first nitride region 11. The second oxygen concentration CO2 may be, for example, the average value of the oxygen concentration CO in the second nitride region 12. The third oxygen concentration CO3 may be, for example, the average value of the oxygen concentration CO in the third nitride region 13.

Hereinafter, experimental results regarding the carbon concentration CC and the oxygen concentration CO in the second nitride region 12 will be described.

In the experiment, the carbon concentration CC and the oxygen concentration CO in the second nitride region 12 are changed by changing the flow rate of the raw material gas when the second nitride region 12 is formed. For example, when the growth pressure is lowered, the carbon concentration CC tends to increase. For example, when the growth rate is increased, the carbon concentration CC tends to increase. For example, when the partial pressure of ammonia is increased, the oxygen concentration CO tends to increase.

For example, when the growth temperature is lowered, the oxygen concentration CO tends to increase.

Figure 3:
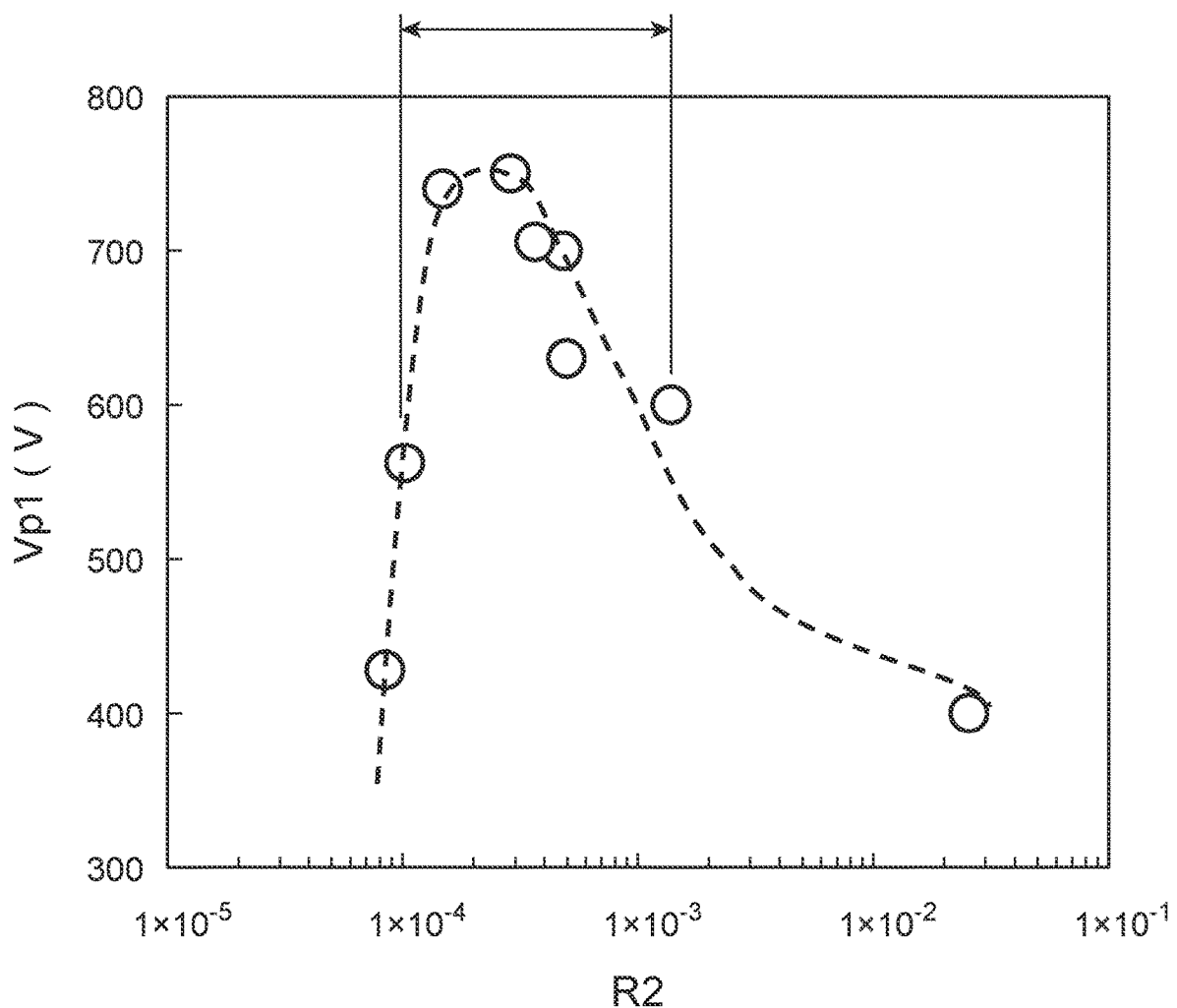
FIG. 3 is a graph illustrating the characteristics of a nitride semiconductor.

FIG. 3 is a graph illustrating the characteristics of the nitride semiconductor.

The horizontal axis in FIG. 3 is a ratio R2. The ratio R2 is the ratio of the second oxygen concentration CO2 to the second carbon concentration CC2 (CO2/CC2). As described above, the second carbon concentration CC2 is the carbon concentration CC in the second nitride region 12. The second oxygen concentration CO2 is the oxygen concentration CO in the second nitride region 12. The vertical axis of FIG. 3 is the punch-through voltage Vp1.

The punch-through voltage Vp1 is evaluated as follows. The voltage between the source electrode formed on the fourth nitride region 14 and the base body 18s is changed, and the current flowing between the source electrode and the drain electrode is measured. In this example, the voltage at which the current value is 1 µA in the voltage-current characteristic is defined as the punch-through voltage.

As shown in FIG. 3, when the ratio R2 is excessively low, the punch-through voltage Vp1 is low. When the ratio R2 is excessively high, the punch-through voltage Vp1 is low. It was found that a high punch-through voltage Vp1 can be obtained when the ratio R2 is not less than $1.0 \times 10^{-4}$ and not more than $1.4 \times 10^{-3}$. The punch-through voltage Vp1 changes critically with respect to the ratio R2. According to the embodiment, it is possible to provide a nitride semiconductor and a semiconductor device capable of improving the characteristics.

For example, in the second nitride region 12, if the oxygen concentration CO is excessively low, it is considered that carbon is difficult to function as an acceptor. If the oxygen concentration CO is excessively high in the second nitride region 12, it is considered that oxygen functions as a donor and current leakage is likely to occur. In the second nitride region 12, a high punch-through voltage Vp1 is obtained at an appropriate ratio R2.

Figure 4:
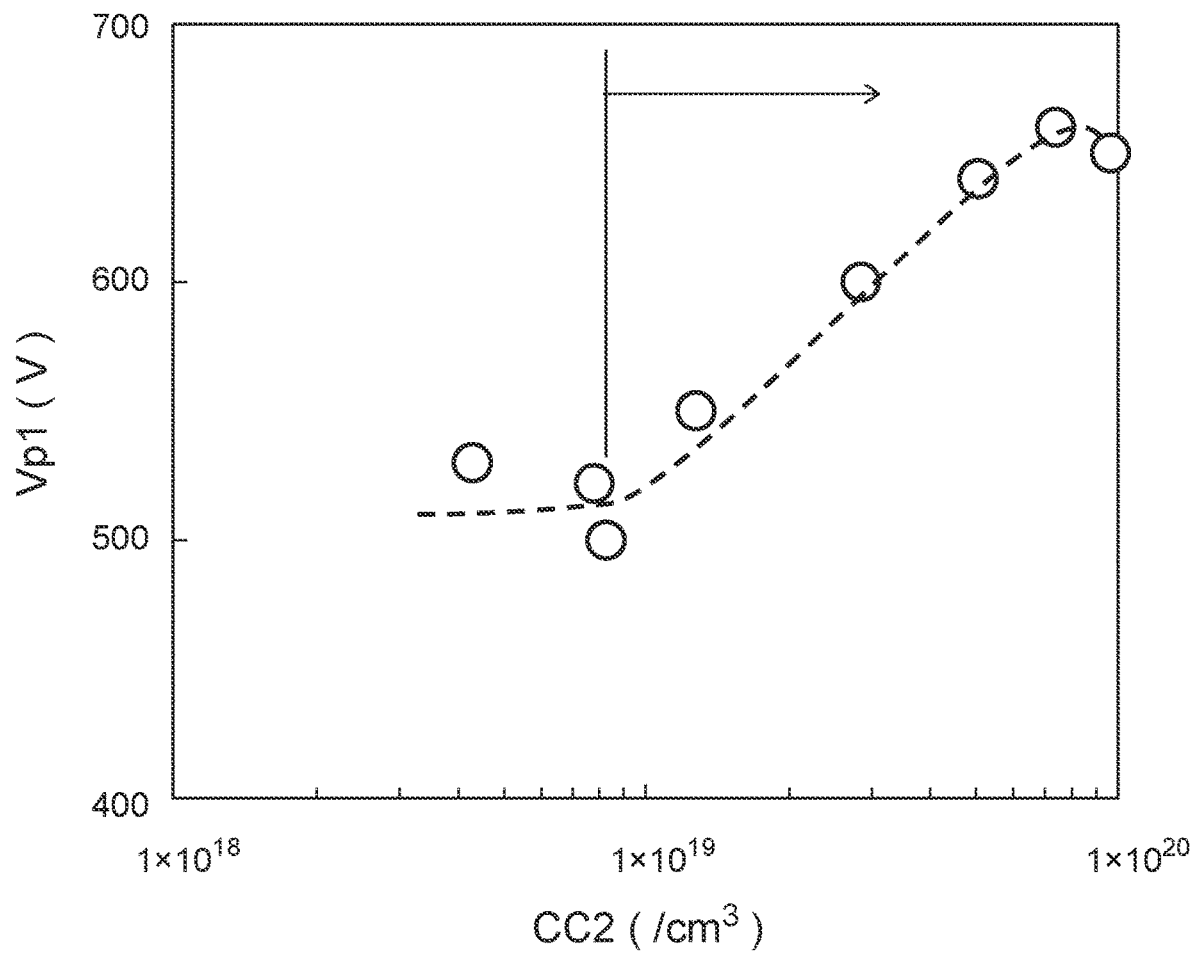
FIG. 4 is a graph illustrating the characteristics of a nitride semiconductor.

FIG. 4 is a graph illustrating the characteristics of the nitride semiconductor.

The horizontal axis in FIG. 4 is the second carbon concentration CC2. As described above, the second carbon concentration CC2 is the carbon concentration CC in the second nitride region 12. The vertical axis of FIG. 4 is the punch-through voltage Vp1.

As shown in FIG. 4, when the second carbon concentration CC2 is less than $8 \times 10^{18}/cm^3$, the punch-through voltage Vp1 is low. When the second carbon concentration CC2 is $8 \times 10^{18}/cm^3$ or more, the punch-through voltage Vp1 becomes high. When the second carbon concentration CC2 is $8 \times 10^{18}/cm^3$ or more and the second carbon concentration CC2 increases, the punch-through voltage Vp1 increases. In the embodiment, the second carbon concentration CC2 is preferably $8 \times 10^{18}/cm^3$ or more. A high punch-through voltage Vp1 can be obtained.

If the second carbon concentration CC2 is excessively high, for example, defects occur and the crystal quality of the second nitride region 12 tends to deteriorate. In the embodiment, the second carbon concentration CC2 is preferably $5 \times 10^{20}/cm^3$ or less. The second carbon concentration CC2 may be $1 \times 10^{20}/cm^3$ or less. This makes it easier to suppress current leakage.

Figure 5:
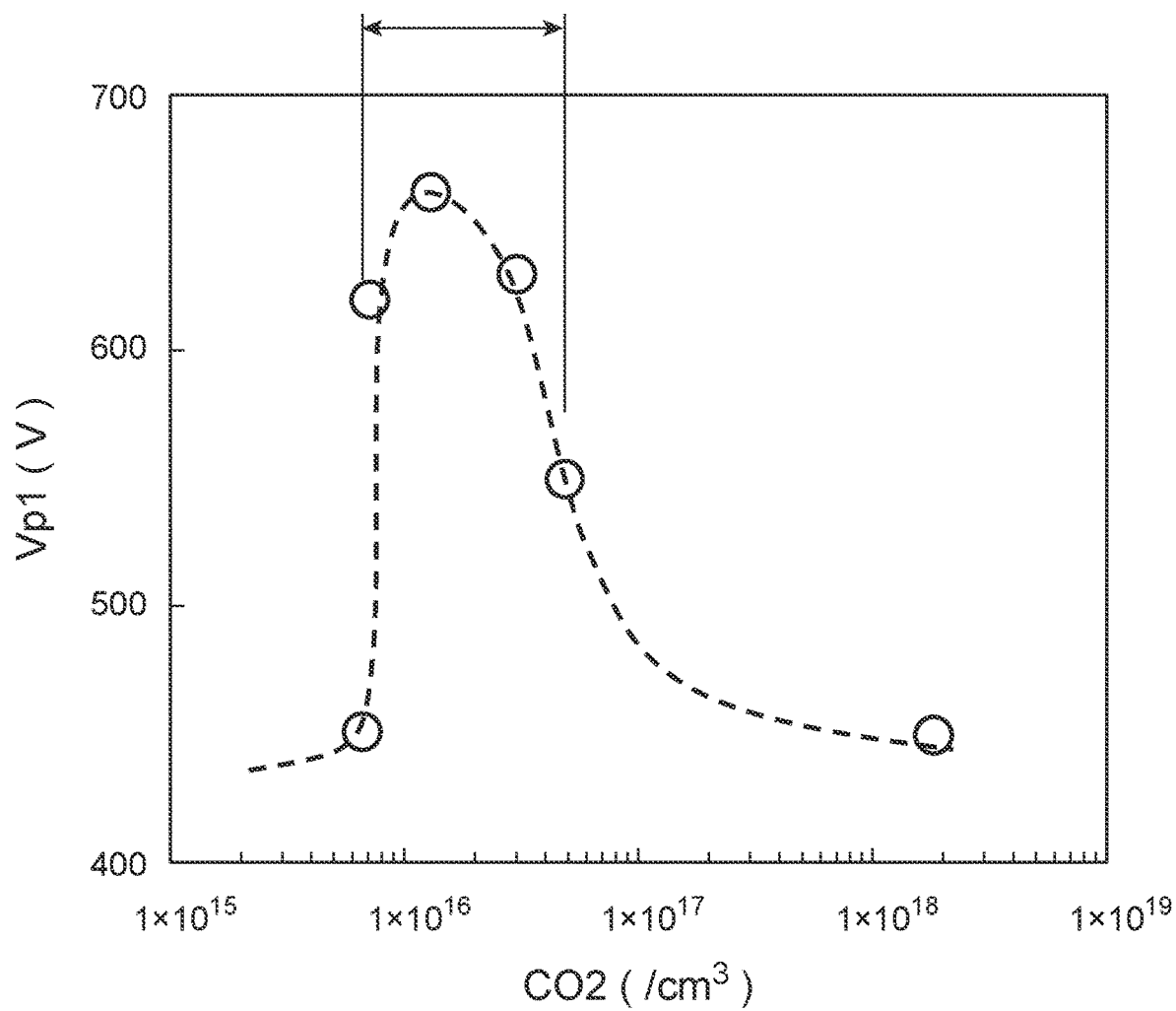
FIG. 5 is a graph illustrating the characteristics of a nitride semiconductor.

FIG. 5 is a graph illustrating the characteristics of the nitride semiconductor.

The horizontal axis in FIG. 5 is the second oxygen concentration CO2. As described above, the second oxygen concentration CO2 is the oxygen concentration CO in the second nitride region 12. The vertical axis of FIG. 4 is the punch-through voltage Vp1.

As shown in FIG. 5, when the second oxygen concentration CO2 is excessively low, the punch-through voltage Vp1 is low. When the second oxygen concentration CO2 is excessively high, the punch-through voltage Vp1 is low. When the second oxygen concentration CO2 is not less than $7 \times 10^{15}/cm^3$ and not more than $4 \times 10^{16}/cm^3$, a high punch-through voltage Vp1 can be obtained. The punch-through voltage Vp1 changes critically with respect to the second oxygen concentration CO2.

In the embodiment, the second carbon concentration CC2 is preferably not less than 2 times and not more than 200 times the first carbon concentration CC1. When the second carbon concentration CC2 is 2 times or more the first carbon concentration CC1, for example, the resistance of the second nitride region 12 tends to increase. When the second carbon concentration CC2 is 200 times or less the first carbon concentration CC1, for example, defects are easily reduced in the second nitride region 12.

In the embodiment, the first carbon concentration CC1 is preferably not less than $5.0 \times 10^{18}/cm^3$ and not more than $1.0 \times 10^{20}/cm^3$. When the first carbon concentration CC1 is $5.0 \times 10^{18}/cm^3$ or more, the resistance of the first nitride region 11 tends to be high. When the first carbon concentration CC1 is $1.0 \times 10^{20}/cm^3$ or less, defects in the first nitride region 11 can be easily reduced.

In the embodiment, the second carbon concentration CC2 is preferably not less than 100 times and not more than 25,000 times the third carbon concentration CC3. When the second carbon concentration CC2 is 100 times or more the third carbon concentration CC3, for example, current leakage in the second nitride region 12 can be easily suppressed. When the second carbon concentration CC2 is 25,000 times or less the third carbon concentration CC3, for example, the resistance of the second nitride region 12 tends to increase.

In the embodiment, for example, the third carbon concentration CC3 is preferably $3.0 \times 10^{16}/cm^3$ or less. When the third carbon concentration CC3 is $3.0 \times 10^{16}/cm^3$ or less, for example, the third nitride region 13 with few defects can be easily obtained.

In the embodiment, the first oxygen concentration CO1 is preferably higher than the second oxygen concentration CO2. For example, the first oxygen concentration CO1 is preferably not less than 2 times and not more than 30 times the second oxygen concentration CO2. When the first oxygen concentration CO1 is 2 times or more the second oxygen concentration CO2, for example, the crystallinity of the second nitride region 12 tends to be high. When the first oxygen concentration CO1 is 30 times or less the second oxygen concentration CO2, for example, the resistance of the first nitride region 11 tends to increase.

In the embodiment, the second oxygen concentration CO2 is preferably higher than the third oxygen concentration CO3. For example, the second oxygen concentration CO2 is preferably not less than 3 times and not more than 20 times the third oxygen concentration CO3. When the second oxygen concentration CO2 is 3 times or more the third oxygen concentration CO3, for example, the acceptor tends to increase. For example, the acceptor in the second nitride region 12 tends to increase. When the second oxygen concentration CO2 is 20 times or less the third oxygen concentration CO3, for example, the crystallinity of the third nitride region 13 tends to be high.

In the embodiment, the first oxygen concentration CO1 is preferably, for example, not less than $1.0 \times 10^{16}/cm^3$ and not more than $5.0\times10^{17}/cm^3$. When the first oxygen concentration CO1 is $1.0\times10^{16}/cm^3$ or more, it is easy to suppress the leakage of the current in the first nitride region 11. When the first oxygen concentration CO1 is $5.0\times10^{17}/cm^3$ or less, the resistance of the first nitride region 11 tends to increase. The first oxygen concentration CO1 may be $1.0\times10^{17}/cm^3$ or less. When the first oxygen concentration CO1 is $1.0\times10^{17}/cm^3$ or less, it is easy to obtain the first nitride region 11 having high crystallinity.

In the embodiment, the third oxygen concentration CO3 is, for example, $5.0\times10^{15}/cm^3$ or less. As a result, the third nitride region 13 having high crystallinity can be easily obtained.

In the embodiment, the composition ratio x2 is preferably less than 0.05, and the composition ratio x3 is preferably less than 0.05. For example, the second nitride region 12 includes GaN, and the third nitride region 13 includes GaN. When the composition ratio x2 is low, high crystallinity can be maintained, and the effect of carbon functioning as an acceptor can be appropriately obtained. By the composition ratio x3 being low, high crystallinity can be maintained, leakage current can be suppressed, and a high punch-through voltage Vp1 can be easily obtained.

As shown in FIG. 1, the first nitride region 11 may include a plurality of first layers 11a and a plurality of second layers 11b. In the first direction D1, one of the plurality of first layers 11a is between one of the plurality of second layers 11b and another of the plurality of second layers 11b. One of the plurality of second layers 11b is between one of the plurality of first layers 11a and another of the plurality of first layers 11a.

The first layers 11a include $Al_{y1}Ga_{1-y1}N$ ($0<y1\le1$). The first layers 11a include, for example, AlN. The composition ratio of Al in the first layers 11a is preferably not less than 0.75 and not more than 1, for example.

The second layers 11b include $Al_{y2}Ga_{1-y2}N$ ($0\le y2<y1$). The second layers 11b include, for example, $Al_{0.13}Ga_{0.87}N$. The composition ratio of Al in the second layers 11b is preferably not less than 0 and not more than 0.6, for example. The composition ratio of Al in the second layers 11b may be, for example, not less than 0.06 and not more than 0.35. The second layers 11b may be GaN.

The effective Al composition ratio (for example, the average Al composition ratio) in the first nitride region 11 corresponds to $(y1\cdot ta+y2\cdot tb)/(ta+tb)$. "ta" is the thickness of one of the first layers 11a. "tb" is the thickness of one of the second layers 11b. The thickness is a length along the first direction D1. The effective composition ratio of Al in the first nitride region 11 is, for example, not less than 0.15 and not more than 0.55. The effective composition ratio of Al in the first nitride region 11 may be, for example, not less than 0.18 and not more than 0.28.

As shown in FIG. 1, the nitride semiconductor 110 may include a fifth nitride region 15. The fifth nitride region 15 includes $Al_{x5}Ga_{1-x5}N$ ($0<x5\le1$). The fifth nitride region 15 includes, for example, AlN. The composition ratio x5 is preferably, for example, not less than 0.5 and not more than 1.

As shown in FIG. 1, the nitride semiconductor 110 may include a sixth nitride region 16. The sixth nitride region 16 includes $Al_{x6}Ga_{1-x6}N$ ($0<x6<1$, $x6<x5$). The sixth nitride region 16 includes, for example, AlGaN. The composition ratio x6 is preferably, for example, not less than 0.1 and not more than 0.8.

The nitride semiconductor 110 may include a fourth nitride region 14. The fourth nitride region 14 includes $Al_{x4}Ga_{1-x4}N$ ($0<x4\le1$, $x3<x4$). There is a third nitride region 13 between the second nitride region 12 and the fourth nitride region 14 in the first direction D1. The fourth nitride region 14 includes, for example, $Al_{0.2}Ga_{0.8}N$. The composition ratio x4 is preferably, for example, not less than 0.05 and not more than 0.35.

For example, the third nitride region 13 includes a portion facing the fourth nitride region 14. For example, a carrier region is formed in this portion. The carrier region is, for example, a two-dimensional electron gas. In a semiconductor device based on a nitride semiconductor 110, the carrier region is used for the operation of the semiconductor device.

The fourth nitride region 14 does not substantially include oxygen. Alternatively, the oxygen concentration in the fourth nitride region 14 is lower than the oxygen concentration CO (second oxygen concentration CO2) in the second nitride region 12. The fourth nitride region 14 does not substantially include carbon. Alternatively, the carbon concentration in the fourth nitride region 14 is lower than the carbon concentration CC in the second nitride region 12 (second carbon concentration CC2). The fourth nitride region 14 does not substantially include impurities that bring about the conductivity. Impurities that bring about the conductivity include, for example, Si or Mg.

The thickness t11 of the first nitride region 11 (see FIG. 1) is preferably, for example, not less than 500 nm and not more than 10,000 nm. The thickness ta of one of the first layers 11a is preferably, for example, not less than 2 nm and not more than 15 nm. The thickness tb of one of the second layers 11b is preferably, for example, not less than 15 nm and not more than 40 nm.

The thickness t12 of the second nitride region 12 (see FIG. 1) is preferably, for example, not less than 500 nm and not more than 5000 nm. The thickness t13 (see FIG. 1) of the third nitride region 13 is preferably not less than 100 nm and not more than 2000 nm, for example. The thickness t14 (see FIG. 1) of the fourth nitride region 14 is preferably, for example, not less than 15 nm and not more than 50 nm.

The thickness t15 of the fifth nitride region 15 (see FIG. 1) is preferably, for example, not less than 50 nm and not more than 400 nm. The thickness t16 of the sixth nitride region 16 (see FIG. 1) is preferably, for example, not less than 50 nm and not more than 500 nm. The above thicknesses are lengths along the first direction D1.

Hereinafter, another example of the nitride semiconductor according to the embodiment will be described.

Figure 6:
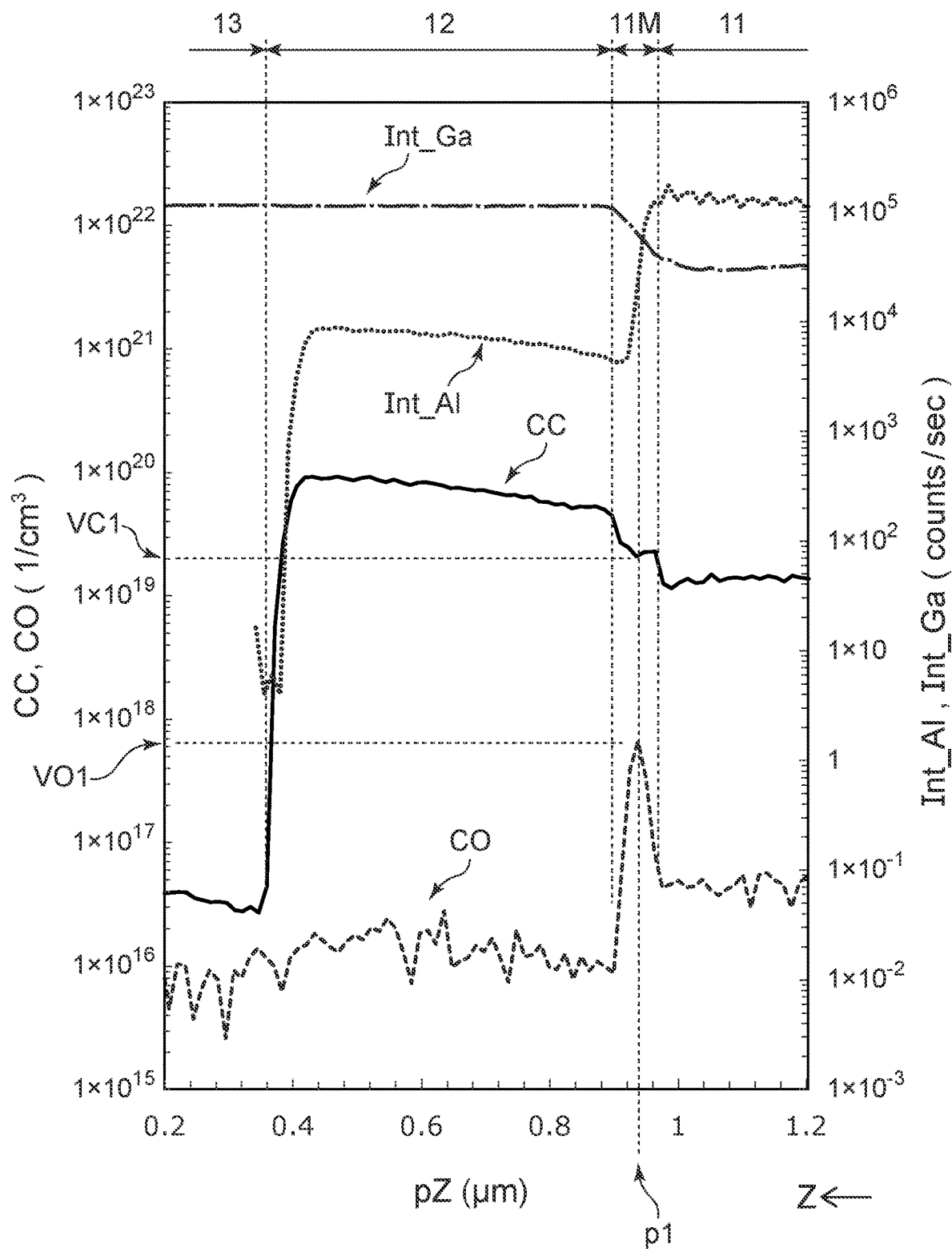
FIG. 6 is a graph illustrating a nitride semiconductor according to the first embodiment.

FIG. 6 is a graph illustrating the nitride semiconductor according to the first embodiment.

FIG. 6 illustrates a SIMS analysis result of the nitride member 10M in the nitride semiconductor 111 according to the embodiment. The horizontal axis of FIG. 6 is the position pZ in the Z-axis direction. The vertical axis on the left side of FIG. 6 is the carbon concentration CC and the oxygen concentration CO. The vertical axis on the right side of FIG. 6 is the detection intensity Int_Al of the secondary ion of Al and the detection intensity Int_Ga of the secondary ion of gallium.

As shown in FIG. 6, in the Z-axis direction (that is, the first direction D1), the oxygen concentration CO in the nitride member 10M becomes a peak value is VO1 at a position p1 between the first nitride region 11 and the second nitride region 12. For example, an intermediate region 11M is provided between the first nitride region 11 and the second nitride region 12. The first position p1 is included in the intermediate region 11M. Dislocations can be bent, for example, in the intermediate region 11M by locally increasing the oxygen concentration CO between the first nitride region 11 and the second nitride region 12. As a result, the defect density in the region above the second nitride region 12 can be reduced. By providing the intermediate region 11M, defects are reduced in the second nitride region 12 (and the third nitride region 13 above the second nitride region 12).

The peak value VO1 is preferably, for example, not less than $1.8 \times 10^{17}/cm^3$ and not more than $5.0 \times 10^{18}/cm^3$. The defect density can be effectively reduced. The peak value VO1 is preferably, for example, about 5 times or more the first oxygen concentration CO1. As a result, the defect density in the second nitride region 12 is likely to be effectively reduced. The peak value VO1 is preferably 18 times or more the second oxygen concentration CO2, for example. As a result, the defect density in the second nitride region 12 is likely to be effectively reduced.

As shown in FIG. 6, the carbon concentration CC at the first position p1 is between the carbon concentration CC in the first nitride region 11 (first carbon concentration CC1) and the carbon concentration CC (the second carbon concentration CC2) in the second nitride region 12. In this example, the concentration (composition ratio) of Al in the first position p1 is between the concentration of Al (composition ratio) in the first nitride region 11 and the concentration (composition ratio) of Al in the second nitride region 12.

The intermediate region 11M is a transition region between the first nitride region 11 and the second nitride region 12. It is considered that dislocations can be bent more effectively in the transition region by the peak oxygen concentration CO being in the transition region. It is considered that this effect reduces defects in the second nitride region 12.

The carbon concentration CC at the first position p1 is preferably, for example, not less than $2.8 \times 10^{19}/cm^3$ and not more than $2.0 \times 10^{20}/cm^3$. When the carbon concentration CC is $2.8 \times 10^{19}/cm^3$ or more, the defect density DD becomes critically low. When the carbon concentration CC is higher than $2.0 \times 10^{20}/cm^3$, lattice relaxation is likely to occur at the interface between the intermediate region 11M and the second nitride region 12. As a result, the crystallinity of the second nitride region 12 tends to decrease.

The ratio of the carbon concentration VC1 at the first position p1 to the peak value VO1 is preferably not less than 40 and not more than 200, for example. In this range, it is easy to effectively reduce the defect density in the second nitride region 12.

The defect density in the second nitride region 12 is lower than the defect density in the first nitride region 11. The defect density in the third nitride region 13 is lower than the defect density in the first nitride region 11. Information on the defect density may be obtained, for example, from a cross-sectional TEM image of the nitride member 10M. By providing the intermediate region 11M, for example, dislocations are reduced in the second nitride region 12 (and the third nitride region 13 above the second nitride region 12). For example, the dislocation density in the second nitride region 12 is lower than the dislocation density in the first nitride region 11. For example, the dislocation density in the third nitride region 13 is lower than the dislocation density in the first nitride region 11.

The intermediate region 11M includes, for example, aluminum. The concentration of aluminum at the first position p1 is lower than the concentration of aluminum in the first nitride region 11 (first aluminum concentration). For example, the second nitride region 12 does not include aluminum. Alternatively, the concentration of aluminum in the second nitride region 12 (second aluminum concentration) is equal to or less than the concentration of aluminum in the first position p1. For example, the aluminum concentration (composition ratio) at the first position p1 is between the aluminum concentration (composition ratio) in the first nitride region 11 and the aluminum concentration (composition ratio) in the second nitride region 12. By providing such an intermediate region 11M in which the oxygen concentration CO becomes a peak, the defect density can be reduced.

The thickness of the intermediate region 11M is preferably, for example, not less than 5 nm and not more than 40 nm.

In the embodiment, the first nitride region 11 does not have to have a laminated structure. The first nitride region 11 may be a nitride semiconductor layer that does not substantially include Al. In this case, the first nitride region 11 includes GaN. In this case, the composition ratio x1 is 0. In this case, the second nitride region 12 includes $Al_{x2}Ga_{1-x2}N$ ($0 \leq x2 < 1$). The third nitride region 13 includes $Al_{x3}Ga_{1-x3}N$ ($0 \leq x3 < 1$). In this case, the second nitride region 12 includes carbon and oxygen. The first nitride region 11 does not include carbon, or the second carbon concentration CC2 in the second nitride region 12 is higher than the first carbon concentration CC1 in the first nitride region 11. The second carbon concentration CC2 is higher than the third carbon concentration CC3 in the third nitride region 13. The ratio of the second oxygen concentration CO2 in the second nitride region 12 to the second carbon concentration CC2 is not less than $1.0 \times 10^{-4}$ and not more than $1.4 \times 10^{-3}$.

Second Embodiment

The second embodiment relates to a semiconductor device. The semiconductor device according to the embodiment includes a nitride semiconductor according to the first embodiment. Hereinafter, an example in which the semiconductor device includes the nitride semiconductor 110 will be described. The semiconductor device may include a nitride semiconductor 111.

Figure 7:
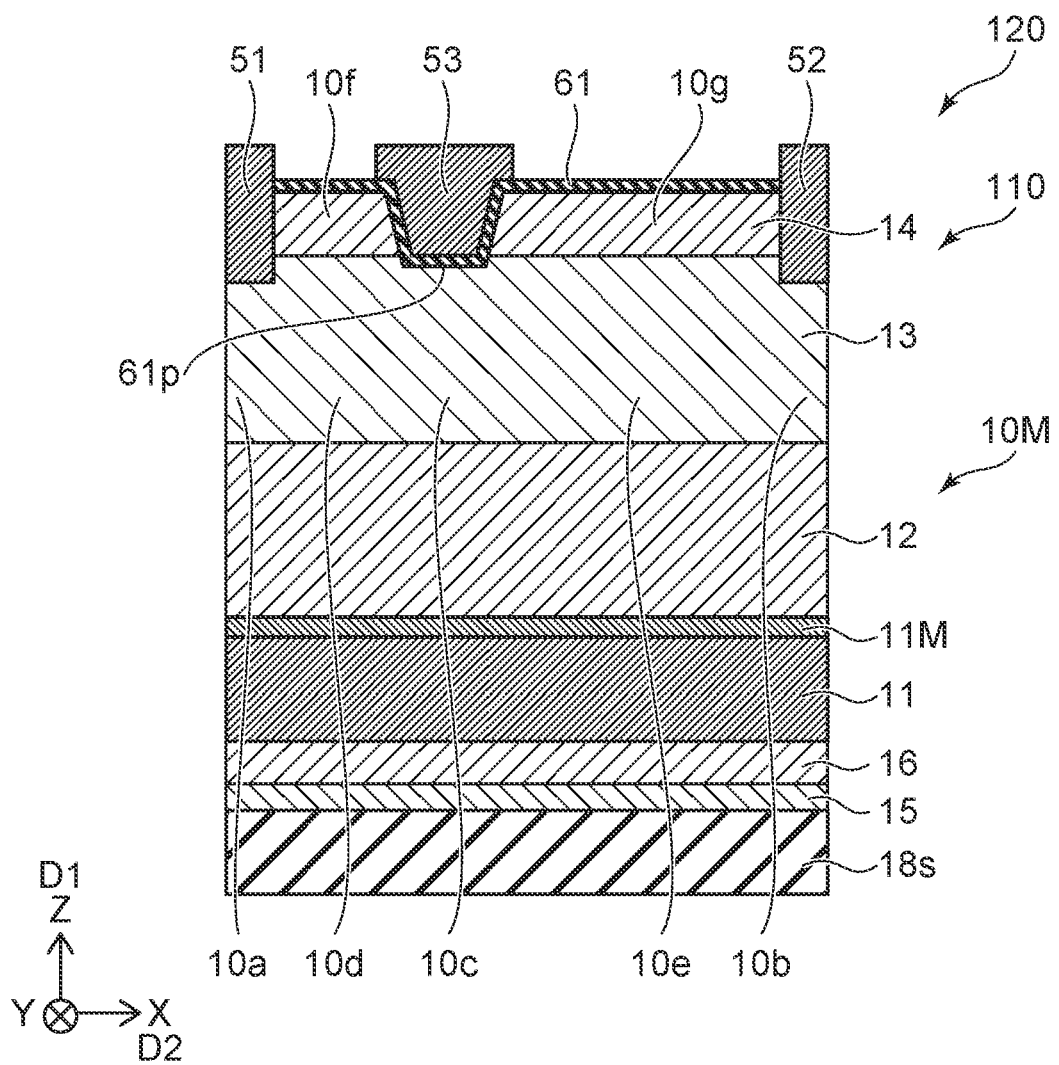
FIG. 7 is a schematic cross-sectional view illustrating the semiconductor device according to the second embodiment.

FIG. 7 is a schematic cross-sectional view illustrating the semiconductor device according to the second embodiment.

As shown in FIG. 7, a semiconductor device 120 according to the embodiment includes a nitride semiconductor 110 according to the first embodiment, a first electrode 51, a second electrode 52, a third electrode 53, and an insulating member 61.

A direction from the first electrode 51 to the second electrode 52 is along a second direction D2 that crosses the first direction D1. The second direction D2 is, for example, the X-axis direction. A position of the third electrode 53 in the second direction D2 is between a position of the first electrode 51 in the second direction D2 and a position of the second electrode 52 in the second direction D2.

The nitride member 10M includes a first nitride region 11, a second nitride region 12, an intermediate region 11M, a third nitride region 13 and a fourth nitride region 14. The third nitride region 13 includes a first partial region 10a, a second partial region 10b, a third partial region 10c, a fourth partial region 10d, and a fifth partial region 10e. A direction from the first partial region 10a to the first electrode 51 is along the first direction D1. A direction from the second partial region 10b to the second electrode 52 is along the first direction D1. The third partial region 10c is between the first partial region 10a and the second partial region 10b in the second direction D2. A direction from the third partial region 10c to the third electrode 53 is along the first direction D1. The fourth partial region 10d is between the first partial region 10a and the third partial region 10c in the second direction D2. The fifth partial region 10e is between the third partial region 10c and the second partial region 10b in the second direction D2.

The fourth nitride region 14 includes a sixth partial region 10f and the seventh partial region 10g. A direction from the fourth partial region 10d to the sixth partial region 10f is along the first direction D1. A direction from the fifth partial region 10e to the seventh partial region 10g is along the first direction D1.

The insulating member 61 is located between the nitride member 10M and the third electrode 53. For example, the insulating member 61 includes a first insulating region 61p. The first insulating region 61p is provided between the third partial region 10c and the third electrode 53 in the first direction D1 (Z-axis direction).

The first electrode 51 is electrically connected with the sixth partial region 10f. The second electrode 52 is electrically connected with the seventh partial region 10g.

In the semiconductor device 120, a current flowing between the first electrode 51 and the second electrode 52 can be controlled by a potential of the third electrode 53. The potential of the third electrode 53 is, for example, a potential based on the potential of the first electrode 51. The first electrode 51 functions as, for example, a source electrode. The second electrode 52 functions as, for example, a drain electrode. The third electrode 53 functions as, for example, a gate electrode. The semiconductor device 120 is, for example, a HEMT (High Electron Mobility Transistor).

According to the embodiment, a high punch-through voltage Vp1 can be obtained. According to the embodiment, it is possible to provide a semiconductor device having improved characteristics.

In the semiconductor device 120, at least a part of the third electrode 53 is located between the sixth partial region 10f and the seventh partial region 10g in the second direction D2. At least a part of the third electrode 53 may be located between the fourth partial region 10d and the fifth partial region 10e in the second direction D2. The first insulating region 61p may be located between the fourth partial region 10d and the fifth partial region 10e. The semiconductor device 120 is, for example, of a normally-off type.

Figure 8:
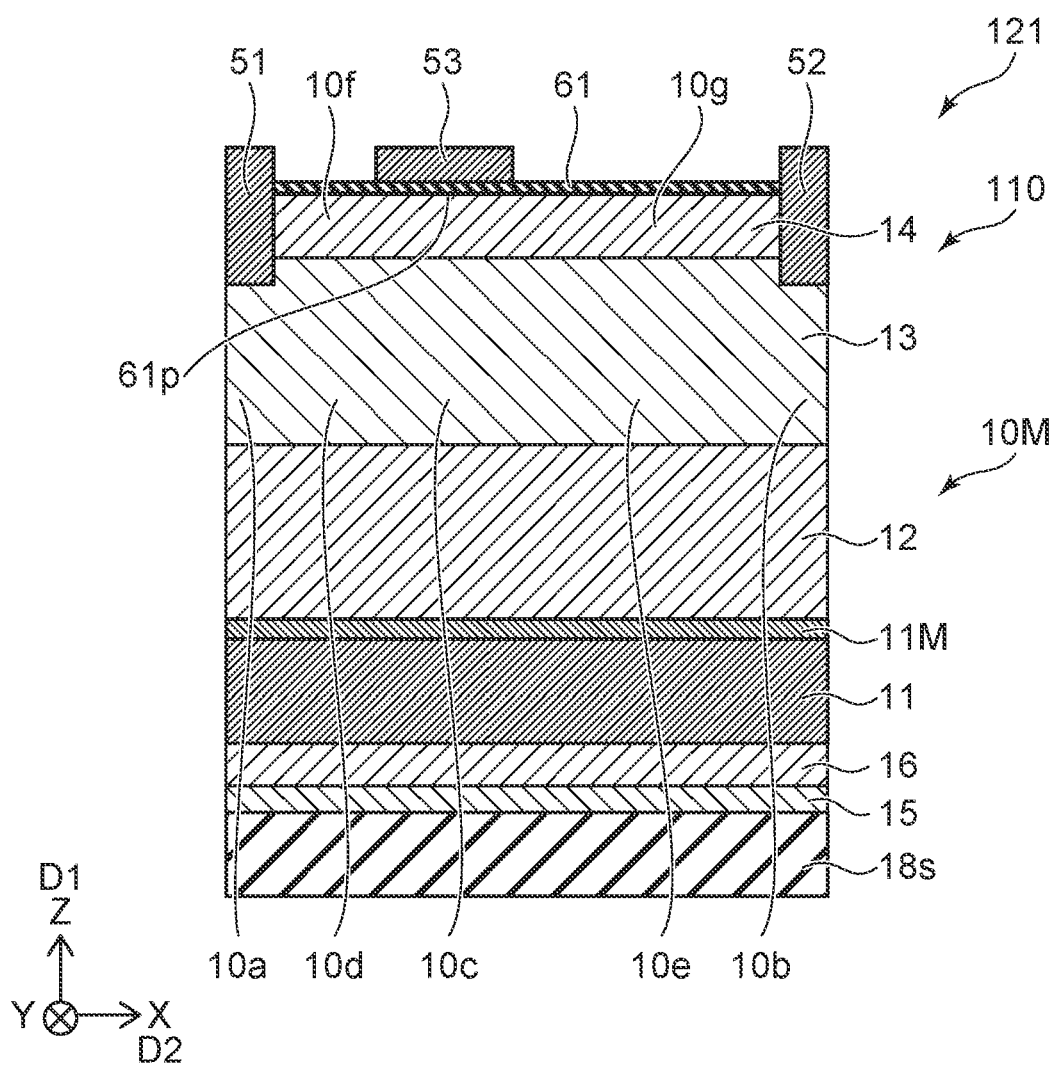
FIG. 8 is a schematic cross-sectional view illustrating the semiconductor device according to the second embodiment.

FIG. 8 is a schematic cross-sectional view illustrating the semiconductor device according to the second embodiment.

As shown in FIG. 8, a semiconductor device 121 according to the embodiment includes a nitride semiconductor 110 according to the first embodiment, a first electrode 51, a second electrode 52, a third electrode 53, and an insulating member 61. In the semiconductor device 121, the third electrode 53 does not overlap the sixth partial region 10f and the seventh partial region 10g in the second direction D2. The third electrode 53 does not overlap the fourth partial region 10d and the fifth partial region 10e in the second direction D2. The semiconductor device 121 is, for example, of a normally-on type. A high punch-through voltage Vp1 can also be obtained in the semiconductor device 121. It is possible to provide a semiconductor device whose characteristics can be improved.

In the embodiment, information regarding the shape of the nitride region and the like can be obtained by, for example, electron microscope observation. Information on the composition and element concentration in the nitride region can be obtained by, for example, EDX (Energy Dispersive X-ray Spectroscopy) or SIMS (Secondary Ion Mass Spectrometry). Information on the composition in the nitride region may be obtained, for example, by X-ray reciprocal lattice space mapping.

According to the embodiment, it is possible to provide a nitride semiconductor and a semiconductor device having improved characteristics.

In the specification of the present application, the "electrically connected state" includes a state in which a plurality of conductors are physically in contact with each other and a current flows between the plurality of conductors. The "electrically connected state" includes a state in which another conductor is inserted between the plurality of conductors and a current flows between the plurality of conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in nitride semiconductors and semiconductor devices such as nitride regions and base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride semiconductors and semiconductor devices practicable by an appropriate design modification by one skilled in the art based on nitride semiconductors and semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor, comprising:
  a nitride member, the nitride member including
  a first nitride region including $Al_{x1}Ga_{1-x1}N$ ($0<x1\leq1$),
  a second nitride region including $Al_{x2}Ga_{1-x2}N$ ($0\leq x2<1$, $x2<x1$), and
  a third nitride region including $Al_{x3}Ga_{1-x3}N$ ($0\leq x3<1$, $x3<x1$),
  the second nitride region being provided between the first nitride region and the third nitride region in a first direction from the first nitride region to the second nitride region,
  the second nitride region including carbon and oxygen,
  the first nitride region not including carbon, or a second carbon concentration in the second nitride region being higher than a first carbon concentration in the first nitride region,
  the second carbon concentration being higher than a third carbon concentration in the third nitride region, a ratio of a first oxygen concentration in the second nitride region to the second carbon concentration being not less than $1.0 \times 10^{-4}$ and not more than $1.4 \times 10^{-3}$.

2. The nitride semiconductor according to claim 1, wherein the second carbon concentration is $8 \times 10^{18}/cm^3$ or more.

3. The nitride semiconductor according to claim 2, wherein the second carbon concentration is $5 \times 10^{20}/cm^3$ or less.

4. The nitride semiconductor according to claim 1, wherein the first oxygen concentration is $7 \times 10^{15}/cm^3$ or more.

5. The nitride semiconductor according to claim 4, wherein the first oxygen concentration is $4 \times 10^{16}/cm^3$ or less.

6. The nitride semiconductor according to claim 1, wherein the second carbon concentration is not less than 2 times and not more than 200 times the first carbon concentration.

7. The nitride semiconductor according to claim 1, wherein the first carbon concentration is not less than $5 \times 10^{18}/cm^3$ and not more than $1 \times 10^{20}/cm^3$.

8. The nitride semiconductor according to claim 1, wherein the second carbon concentration is not less than 100 times and not more than 25,000 times the third carbon concentration.

9. The nitride semiconductor according to claim 1, wherein the third carbon concentration is $3 \times 10^{16}/cm^3$ or less.

10. The nitride semiconductor according to claim 1, wherein a second oxygen concentration in the first nitride region is not less than 2 times and not more than 30 times the first oxygen concentration.

11. The nitride semiconductor according to claim 10, wherein the second oxygen concentration is not less than $1 \times 10^{16}/cm^3$ and not more than $5 \times 10^{17}/cm^3$.

12. The nitride semiconductor according to claim 1, wherein the second oxygen concentration is not less than 3 times and not more than 20 times a third oxygen concentration in the third nitride region.

13. The nitride semiconductor according to claim 1, wherein
the second nitride region includes GaN, and
the third nitride region includes GaN.

14. The nitride semiconductor according to claim 1, wherein a thickness of the second nitride region is not less than 500 nm and not more than 5000 nm.

15. The nitride semiconductor according to claim 1, wherein
the first nitride region includes a plurality of first layers and a plurality of second layers,
in the first direction, one of the first layers is between one of the second layers and an other one of the second layers, and the one of the second layers is between the one of the first layers and the other one of the first layers,
the first layers include $Al_{y1}Ga_{1-y1}N$ ($0<y1\leq1$), and
the second layers include $Al_{y2}Ga_{1-y2}N$ ($0\leq y2<y1$).

16. The nitride semiconductor according to claim 1, further comprising a base body,
the first nitride region being between the base body and the second nitride region.

17. The nitride semiconductor according to claim 16, wherein
the nitride member further includes a fourth nitride region including $Al_{x5}Ga_{1-x5}N$ ($0<x5\leq1$), and
the fourth nitride region is between the base body and the first nitride region in the first direction.

18. The nitride semiconductor according to claim 1, wherein
the nitride member further includes a fourth nitride region including $Al_{x4}Ga_{1-x4}N$ ($0<x4\leq1$, $x3<x4$), and
the third nitride region is between the second nitride region and the fourth nitride region in the first direction.

19. A semiconductor device comprising:
the nitride semiconductor according to claim 18;
a first electrode;
a second electrode;
a third electrode; and
an insulating member,
a direction from the first electrode to the second electrode being along a second direction crossing the first direction,
a position of the third electrode in the second direction being between a position of the first electrode in the second direction and a position of the second electrode in the second direction,
the third nitride region including a first partial region, a second partial region, a third partial region, a fourth partial region, and a fifth partial region,
a direction from the first partial region to the first electrode being along the first direction,
a direction from the second partial region to the second electrode being along the first direction,
the third partial region being between the first partial region and the second partial region in the second direction, and a direction from the third partial region to the third electrode being along the first direction,
the fourth partial region being between the first partial region and the third partial region in the second direction,
the fifth partial region being located between the third partial region and the second partial region in the second direction,
the fourth nitride region including a sixth partial region and a seventh partial region,
a direction from the fourth partial region to the sixth partial region being along the first direction,
a direction from the fifth partial region to the seventh partial region being along the first direction and
the insulating member being between the nitride member and the third electrode.

20. The semiconductor device according to claim 19, wherein at least a portion of the third electrode is located between the sixth partial region and the seventh partial region in the second direction.

* * * * *